United States Patent
Reznicek et al.

(10) Patent No.: US 12,108,686 B2
(45) Date of Patent: Oct. 1, 2024

(54) PARAMAGNETIC HEXAGONAL METAL PHASE COUPLING SPACER

(71) Applicant: International Business Machines Corporation, Armonk, NY (US)

(72) Inventors: Alexander Reznicek, Troy, NY (US); Matthias Georg Gottwald, New Rochelle, NY (US); Stephen L Brown, Carmel, NY (US)

(73) Assignee: International Business Machines Corporation, Armonk, NY (US)

( * ) Notice: Subject to any disclaimer, the term of this patent is extended or adjusted under 35 U.S.C. 154(b) by 471 days.

(21) Appl. No.: 17/550,464

(22) Filed: Dec. 14, 2021

(65) Prior Publication Data
US 2023/0189658 A1    Jun. 15, 2023

(51) Int. Cl.
*H10N 50/80* (2023.01)
*G11C 11/16* (2006.01)
*H10B 61/00* (2023.01)

(52) U.S. Cl.
CPC .......... *H10N 50/80* (2023.02); *G11C 11/161* (2013.01); *H10B 61/00* (2023.02)

(58) Field of Classification Search
CPC ....... H10N 50/80; H10B 61/00; G11C 11/161
USPC ........................................................ 257/421
See application file for complete search history.

(56) References Cited

U.S. PATENT DOCUMENTS

| | | |
|---|---|---|
| 9,093,640 B2 | 7/2015 | Aggarwal et al. |
| 10,804,319 B2 | 10/2020 | Gottwald |
| 10,868,235 B2 | 12/2020 | Beach et al. |
| 10,978,234 B2 | 4/2021 | Chatterjee et al. |
| 11,081,154 B1 | 8/2021 | Xiao et al. |

(Continued)

FOREIGN PATENT DOCUMENTS

| | | |
|---|---|---|
| CN | 103545443 A | 1/2014 |
| CN | 110476264 A | 11/2019 |
| CN | 111640858 A | 9/2020 |

OTHER PUBLICATIONS

International Search Report dated Feb. 24, 2023 received in a corresponding foreign application, 7 pages.

(Continued)

*Primary Examiner* — Jami Valentine Miller
(74) *Attorney, Agent, or Firm* — Scully, Scott, Murphy & Presser, P.C.; Daniel P. Morris, Esq.

(57) ABSTRACT

A top pinned SAF-containing magnetic tunnel junction structure is provided that contains a coupling spacer composed of a paramagnetic hexagonal metal phase material that has a stoichiometric ratio of $Me_3X$ or $Me_2X$, wherein Me is a magnetic metal having a magnetic moment and X is a metal that alloys with Me in a hexagonal phase and dilutes the magnetic moment of Me. In embodiments in which a $Me_3X$ coupling spacer is present, Me is cobalt, and X is vanadium, niobium, tantalum, molybdenum or tungsten. In embodiments in which a $Me_2X$ coupling spacer is present, Me is iron and X is tantalum or tungsten. The coupling spacer is formed by providing a material stack including at least a precursor paramagnetic hexagonal metal phase material forming multilayered structure that includes alternating layers of magnetic metal, Me, and metal, X, and then thermally soaking the material stack.

27 Claims, 2 Drawing Sheets

(56) References Cited

U.S. PATENT DOCUMENTS

| | | | |
|---|---|---|---|
| 2015/0340600 A1* | 11/2015 | Kim | G11C 11/1659 |
| | | | 257/421 |
| 2018/0248110 A1 | 8/2018 | Kardasz et al. | |
| 2021/0125650 A1 | 4/2021 | Jung et al. | |
| 2021/0233576 A1* | 7/2021 | Xiao | H10N 50/85 |
| 2021/0249060 A1 | 8/2021 | Woo et al. | |

OTHER PUBLICATIONS

Swerts, J., et al., "Top pinned magnetic tunnel junction stacks with high annealing tolerance for high density STT-MRAM applications", Conference Paper, ResearchGate, Apr. 2017, 2 pages.

Swerts, J., et al., "Solving the BEOL compatibility challenge of toppinned magnetic tunnel junction stacks", 2017 IEEE International Electron Devices Meeting (IEDM), Date of Conference: Dec. 2-6, 2017, 4 pages.

Liu, E., et al., "Synthetic-Ferromagnet Pinning Layers Enabling Top-Pinned Magnetic Tunnel Junctions for High-Density Embedded Magnetic Random-Access Memory", Physical Review Applied, American Physical Society, Nov. 2018, 10, 11 pages.

* cited by examiner

PARAMAGNETIC HEXAGONAL METAL PHASE COUPLING SPACER

BACKGROUND

The present application relates to a memory structure, and more particularly to a top pinned synthetic anti-ferromagnetic-containing magnetic tunnel junction (MTJ) structure that includes a layer of platinum and a paramagnetic hexagonal metal phase coupling spacer.

MRAM is a non-volatile random access memory technology in which data is stored by magnetic storage elements. These elements are typically formed from two ferromagnetic plates, each of which can hold a magnetization, separated by a thin dielectric layer (i.e., a tunnel barrier layer). One of the two plates (i.e., the magnetic reference or pinned layer) is a magnet whose magnetic moment direction is set to a particular direction; the other plate's (i.e., the magnetic free layer's) magnetization can be changed in at least two different directions, representing different digital states such as 0 and 1 for memory applications. In MRAMs, such elements may be referred to as a magnetic tunnel junction (MTJ) structure. In a typical MTJ structure, the magnetization of the magnetic reference layer is fixed in one direction (say pointing up), while the direction of the magnetic free layer can be "switched" by some external forces, such as a magnetic field or a spin-transfer torque generating charge current. A smaller current (of either polarity) can be used to read the resistance of the device, which depends on the relative orientations of the magnetizations of the magnetic free layer and the magnetic reference layer. The resistance is typically higher when the magnetizations are anti-parallel, and lower when they are parallel (though this can be reversed, depending on the material).

MTJ structures can be grouped into bottom pinned MTJ structures in which the magnetic reference layer is located at the bottom of the MTJ structure, or top pinned MTJ structures in which the magnetic reference layer is located at the top of the MTJ structure. Top pinned MTJ structures including synthetic anti-ferromagnetic (SAF) coupling layers (hereinafter top pinned SAF-containing MTJs) are needed for certain MRAM applications, mainly spin-orbit torque (SOT) MRAM with its advantage of independent read and write current paths. In top pinned SAF-containing MTJs, the SAF coupling layer is located within a multilayered structure that includes an upper magnetic reference layer and a lower magnetic reference layer. Formation of a SAF coupling layer into a top pinned MTJ structure is not trivial since there is no seed layer to grow the SAF coupling layer. Also, and since the SAF coupling layer has to be in direct contact with the magnetic reference layers of the top pinned MTJ structure, forming the right texture to form a working SAF coupling layer is very challenging. Platinum will help form the required texture, but having a platinum layer near the magnetic free layer, or having platinum diffusion into the magnetic free layer, will likely decrease the perpendicular magnetic anisotropy (PMA) of the magnetic free layer. Insertion of a platinum diffusion barrier layer, as used in conventional bottom pinned SAF-containing MTJ structures, into a top pinned SAF-containing MTJ structure is not trivial since such those layers require the proper texture.

SUMMARY

A top pinned SAF-containing magnetic tunnel junction structure for use in memory applications is provided that contains a layer of platinum and a coupling spacer. The coupling spacer is composed of a paramagnetic hexagonal metal phase material that has a stoichiometric ratio of $Me_3X$ or $Me_2X$, wherein Me is a magnetic metal having a moment and X is a metal that alloys with Me in a hexagonal phase and dilutes the magnetic moment of Me. In embodiments in which a $Me_3X$ coupling spacer is present, Me is cobalt (Co), and X is vanadium (V), niobium (Nb), tantalum (Ta), molybdenum (Mo) or tungsten (W). In other embodiments in which a $Me_2X$ coupling spacer is present Me is iron (Fe) and X is tantalum (Ta) or tungsten (W). The paramagnetic hexagonal metal phase material is formed by providing a material stack including at least a precursor paramagnetic hexagonal metal phase material forming multilayered structure that includes alternating layers of magnetic metal, Me, and metal, X, and then thermally soaking the material stack.

In one aspect of the present application, a memory structure is provided. In one embodiment of the present application, the memory structure includes a top pinned magnetic tunnel junction structure including, from bottom to top, a magnetic free layer, a tunnel barrier layer, a paramagnetic hexagonal metal phase coupling spacer, a layer of platinum, and a multilayered magnetic reference structure containing a synthetic anti-ferromagnetic (SAF) coupling layer located between a lower magnetic reference layer and an upper magnetic reference layer.

In embodiments of the present application, the paramagnetic hexagonal metal phase coupling spacer is composed of a material having a formula $Me_3X$, wherein Me is cobalt (Co) and X is vanadium (V), niobium (Nb), tantalum (Ta), molybdenum (Mo) or tungsten (W). In such embodiments, X can be Nb or V, leading to $Co_3Nb$ or $Co_3V$. In other embodiments, X can be W or Mo. In still other embodiments, the paramagnetic hexagonal metal phase coupling spacer is composed of a material having a formula $Me_2X$, wherein Me is iron (Fe) and X is tantalum (Ta) or tungsten (W), leading to $Fe_2Ta$ or $Fe_2W$.

In embodiments of the present application, the paramagnetic hexagonal metal phase coupling spacer has a magnetic moment. In such embodiments, the magnetic moment per area of the paramagnetic hexagonal metal phase coupling spacer can be from 0 to 0.1 memu/cm$^2$; the term "emu" stands for electromagnetic unit. In embodiments of the present application, the paramagnetic hexagonal metal phase coupling spacer is a thick layer having a thickness from 0.2 nm to 3 nm. In embodiments of the present application, the paramagnetic hexagonal metal phase coupling spacer has a thickness that inhibits platinum diffusion into the magnetic free layer. In embodiments, the layer of platinum is a thin layer having a thickness from 0.2 nm to 3 nm. In embodiments, the SAF coupling layer has a coupling field plateau from 4000 Oe up to 6000 Oe. In embodiments, the multi-layered magnetic reference structure has a hexagonal crystal structure.

In embodiments of the present application, the SAF coupling layer is a non-magnetic material that couples in an anti-parallel fashion the lower magnetic reference layer and the upper magnetic reference layer. In such embodiments, the SAF coupling layer comprises ruthenium (Ru), iridium (Ir), rhodium (Rh) or alloys of Ru, Ir or Rh with each other (e.g., RuIr with Ru or Ir composition from 0 to 100%).

In embodiments of the present application, the memory structure further includes a polarization enhancing layer and a non-magnetic spacer located between the tunnel barrier layer and the paramagnetic hexagonal metal phase coupling spacer.

In another aspect of the present application, a method is provided for forming a paramagnetic hexagonal metal phase material coupling spacer in a top pinned SAF-containing MTJ structure. In one embodiment, the method includes forming a material stack including a magnetic free layer, a tunnel barrier layer, and a precursor paramagnetic hexagonal metal phase material forming multilayered structure, wherein the precursor paramagnetic hexagonal metal phase material forming multilayered structure includes alternating layers of a magnetic metal, Me, having a magnetic moment, and a metal, X, that alloys with Me in a hexagonal phase and dilutes the magnetic moment of Me. The alternating layers have "the right" thickness (atom ratio) to facility the formation of the $Me_3X$ phase or $Me_2X$ phase. This material stack can be thermally soaked in, for example, a UHV deposition system, to convert the precursor paramagnetic hexagonal metal phase material forming multilayered structure into a paramagnetic hexagonal metal phase material coupling spacer. Next, a layer of platinum and a multilayered magnetic reference structure including a synthetic anti-ferromagnetic (SAF) coupling layer located between a lower magnetic reference layer and an upper magnetic reference layer are formed in a stacked fashion on the paramagnetic hexagonal metal phase material coupling spacer.

In embodiments, the precursor paramagnetic hexagonal metal phase material forming multilayered structure is formed by co-sputtering from a magnetic metal, Me, containing target, and from a metal, X, containing target. In embodiments, the precursor paramagnetic hexagonal metal phase material forming multilayered structure has a thickness or atom ratio Me and X that provides the paramagnetic hexagonal metal phase material coupling spacer.

In embodiments, the thermal soaking is performed at a temperature from 300° C. to 450° C. In embodiments, the thermal soaking is performed in a vacuum or in an inert ambient.

In some embodiments, the method includes forming a material stack including a magnetic reference layer, a tunnel barrier layer, a precursor paramagnetic hexagonal metal phase material forming multilayered structure, a layer of platinum and a multilayered magnetic reference structure, wherein the precursor paramagnetic hexagonal metal phase material forming multilayered structure comprises alternating layers of a magnetic metal, Me, having a magnetic moment, and a metal, X, wherein X is a metal that alloys with Me in a hexagonal phase and dilutes the magnetic moment of Me. The alternating layers have "the right" thickness (atom ratio) to facility the formation of the $Me_3X$ phase or $Me_2X$ phase. Next, the material stack is subjected to a thermal soak to convert the precursor paramagnetic hexagonal metal phase material forming multilayered structure into a paramagnetic hexagonal metal phase material coupling spacer.

In either method embodiment, Me can be cobalt (Co) and X can be vanadium (V), niobium (Nb), tantalum (Ta), molybdenum (Mo) or tungsten (W), and the paramagnetic hexagonal metal phase material coupling spacer has a formula $Me_3X$.

Alternatively, and in either method embodiment, Me can be iron (Fe) and X can be tantalum (Ta) or tungsten (W), and the paramagnetic hexagonal metal phase material coupling spacer has a formula $Me_2X$.

DETAILED DESCRIPTION

Figure 2A:
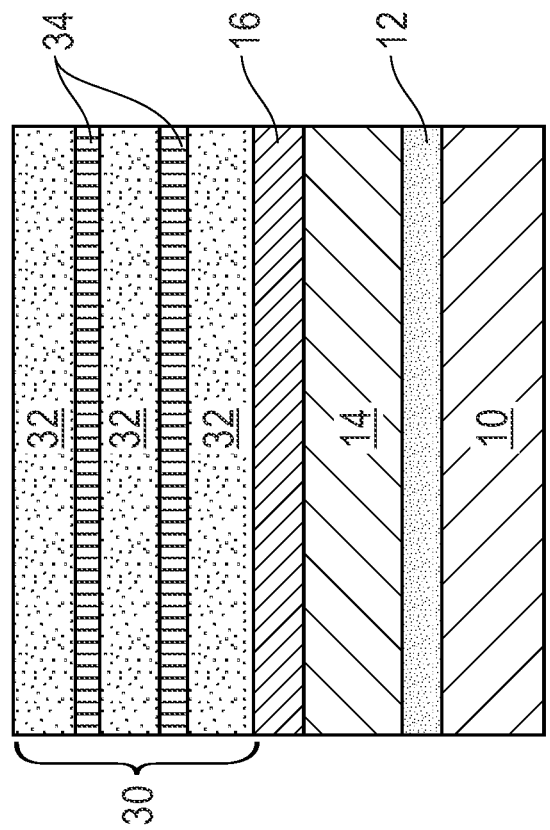
FIGS. 2A-2B are cross sectional views showing the basic processing steps that can be employed in forming the exemplary memory structure shown in FIG. 1 in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
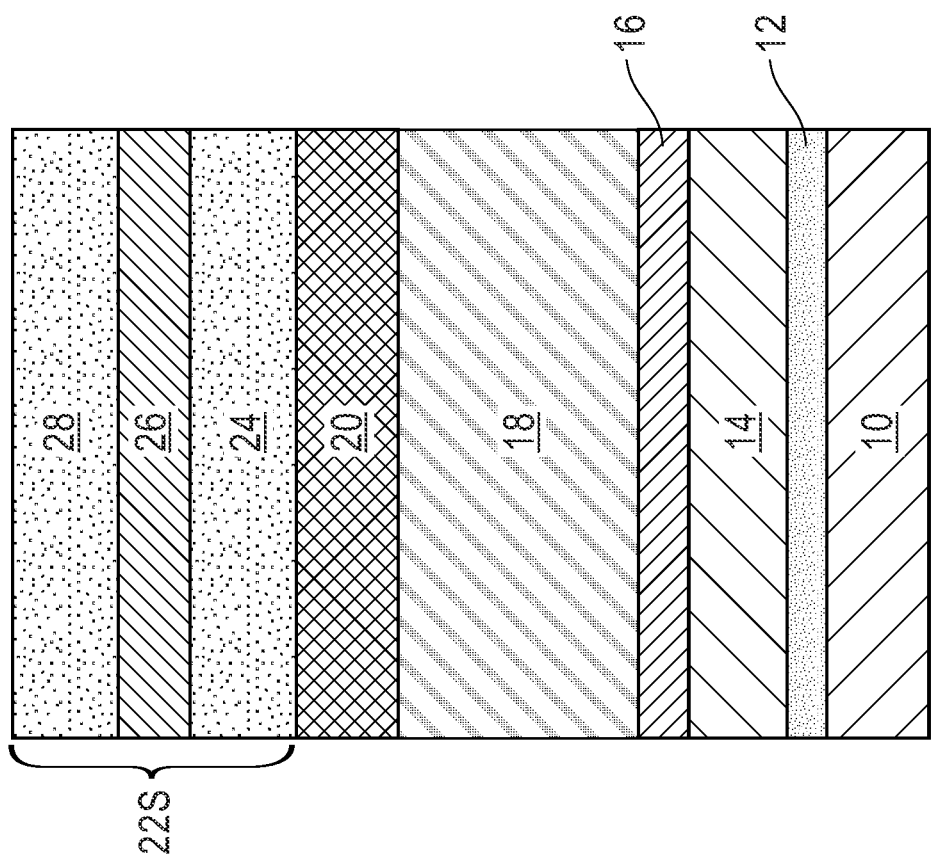
FIG. 1 is a cross sectional view of an exemplary memory structure accordance with an embodiment of the present application.

The present application provides a memory structure that includes a top pinned magnetic tunnel junction structure such as is illustrated in FIG. 1 of the present application. The top pinned magnetic tunnel junction structure includes, from bottom to top, a magnetic free layer 10, a tunnel barrier layer 12, a paramagnetic hexagonal metal phase coupling spacer 18, a layer of platinum 20, and a multilayered magnetic reference structure 22S containing a synthetic anti-ferromagnetic (SAF) coupling layer 26 located between a lower magnetic reference layer 24 and an upper magnetic reference layer 28. In embodiments, the top pinned magnetic tunnel junction structure further includes a polarization enhancing layer 14 and a non-magnetic spacer 16 positioned between the tunnel barrier layer 12 and the paramagnetic hexagonal metal phase coupling spacer 18. In some embodiments, the polarization enhancing layer 14 and the non-magnetic spacer 16 can be omitted from the top pinned magnetic tunnel junction structure of the present application.

Although not illustrated in the present application, the top pinned magnetic tunnel junction structure is located between a bottom electrode and a top electrode. The bottom electrode would be located beneath the magnetic free layer 10, while the top electrode would be located above the multilayered magnetic reference structure 22S. The bottom electrode and top electrode mentioned above can be composed of a conductive material such as, for example, Ta, TaN, Ti, TiN, Ru, RuN, RuTa, RuTaN, Co, CoWP, CoN, W, WN or any combination thereof. In some embodiments, the conductive material that provides the bottom electrode can be compositionally different from the conductive material that provides the top electrode. In other embodiments, the conductive material that provides the bottom electrode can be compositionally the same as the conductive material that provides the top electrode. The bottom electrode and top electrode can be formed utilizing techniques, including a deposition process, that is well known to those skilled in the art.

In embodiments, the bottom electrode is located on a surface of an electrically conductive structure that is embedded in an interconnect dielectric material layer of one interconnect level of a multilayered interconnect structure. The one interconnect level including the electrically conductive structure can be located above at least one underlying metal level (not shown) and a front-end-of-the-level (FEOL) also not shown. In some embodiments, the metal level can be a middle-of-the line (MOL) level. In other embodiments, the metal level can be at least one lower interconnect level of a multi-level interconnect structure. In yet further embodiments, the metal level can be a combination of a MOL level and at least one lower interconnect level of a multi-level interconnect structure. The metal level can include electrically conductive structures embedded in a dielectric material layer. The FEOL can include a semiconductor substrate having one or more semiconductor devices (such as, for example, transistors) formed thereon. The metal level and the FEOL can be formed utilizing materials and techniques that are well known to those skilled in the art. So not to obscure the memory structure of the present application, the materials and techniques used in providing the interconnect level including the electrically conductive structure, metal level and the FEOL are not described in the present application.

The magnetic free layer 10 of the top pinned magnetic tunnel junction structure of the present application has a magnetization that can be changed in orientation relative to the magnetization orientation of multilayered magnetic reference structure 20S. The magnetic free layer 10 can have a thickness from 0.3 nm to 3 nm; although other thicknesses are possible and can be used as the thickness of the magnetic free layer 10. The magnetic free layer 10 can be composed of a magnetic material or a stack of magnetic materials that are well known to those skilled in the art. In some embodiments, the magnetic free layer 10 includes alloys and/or multilayers of cobalt (Co), iron (Fe), alloys of cobalt-iron, nickel (Ni), alloys of nickel-iron, and alloys of cobalt-iron-boron. In other embodiments, the magnetic free layer 10 is composed of an ordered magnetic alloy. By "ordered magnetic alloy" it is meant a magnetic alloy that has a lattice structure in which atoms of one element occupy particular sites and atoms of at least one other element occupy other sites. In one embodiment, the ordered magnetic alloy that provides the magnetic free layer is a Heusler alloy. The term "Heusler alloy" is used herein to denote an intermetallic ternary compound of the formula $A_2BA$, which possesses the Heusler of half-Heusler crystal structure. Exemplary Heusler alloys that can be used in the present application include, but are not limited to, $Mn_3Ge$, $Mn_3Ga$, $Co_2MnSi$, $Mn_3Sn$ or $Mn_3Sb$. In another embodiment, the ordered magnetic alloy that provides magnetic free layer 10 is a L10 alloy. The term "L10 alloy" denotes an intermetallic compound with a body centered tetragonal crystal structure wherein one element occupies the corners of the lattice cell, and the other element occupies the body center. Exemplary L10 alloys that can be used in the present application include, but are not limited to, MnAl or CoFe. The order magnetic alloys require a seeding layer to be located beneath the order magnetic alloy.

The tunnel barrier layer 12 of the top pinned magnetic tunnel junction structure of the present application is composed of an insulator material and is formed at a thickness sufficient to provide an appropriate tunneling resistance. Exemplary insulator materials for the tunnel barrier layer 12 include, but are not limited to, magnesium oxide, aluminum oxide, and titanium oxide, or materials of higher electrical tunnel conductance, such as semiconductors or low-bandgap insulators. The thickness of the tunnel barrier layer 12 will depend on the material selected. In one example, the tunnel barrier layer 12 can have a thickness from 0.5 nm to 1.5 nm; although other thicknesses are possible as long as the thickness of the tunnel barrier layer 12 provides an appropriate tunneling resistance.

As mentioned above and in some embodiments, the top pinned magnetic tunnel junction structure of the present application can further include a polarization enhancing layer 14. When present, the polarization enhancing layer 14 has at least one surface that forms an interface with a surface of the tunnel barrier layer 12. The polarization enhancing layer 14 is used in embodiments in which a substantially larger tunnel magnetoresistance (TMR) is required. The polarization enhancing layer 14 can include an iron (Fe) layer, a Fe-based alloy layer having a body centered cubic (bcc) structure, a cobalt iron boride (CoFeB)-based amorphous alloy layer, a L21 Heusler alloy layer (such as, for example, $Co_2MnSi$) or combinations thereof. The polarization enhancing layer 14 can have a thickness from 0.2 nm to 2 nm; although other thicknesses are contemplated and can be used in the present application for the thickness of the polarization enhancing layer 14.

As mentioned above and in some embodiments, the top pinned magnetic tunnel junction structure of the present application can further a non-magnetic spacer 16; in the present application non-magnetic spacer 16 is used in conjunction with the polarization enhancing layer 14. In embodiments, the non-magnetic spacer 16 has a first surface that forms an interface with a surface of the polarization enhancing layer 14 that is opposite the surface of the polarization enhancing layer 14 that forms an interface with the tunnel barrier layer 12, and a second surface, that is opposite the first surface that forms an interface with the coupling spacer 18. The non-magnetic spacer 16 can be composed of tungsten (W), magnesium (Mg), aluminum (Al), copper (Cu), vanadium (V), titanium (Ti), chromium (Cr), manganese (Mn), tantalum (Ta), molybdenum (Mo), hafnium (Hf), rhenium (Re) or any combination thereof. The non-magnetic spacer 16 can have a thickness from 0.1 nm to 0.5 nm; although other thicknesses are contemplated and can be used in the present application for the thickness of the non-magnetic spacer 16.

In some embodiments, the paramagnetic hexagonal metal phase coupling spacer 18 which can form an interface with the non-magnetic spacer 16 or with the tunnel barrier layer 12 is composed of a material having a formula $Me_3X$, wherein Me is cobalt (Co), and X is vanadium (V), niobium (Nb), tantalum (Ta), molybdenum (Mo) or tungsten (W); such a material has a paramagnetic hexagonal metal phase. In some embodiments, the paramagnetic hexagonal metal phase coupling spacer 18 can be one of $Co_3W$, $Co_3Mo$, $Co_3V$, $Co_3Nb$ or $Co_3Ta$. In other embodiments, the paramagnetic hexagonal metal phase coupling spacer 18 which can form an interface with the non-magnetic spacer 16 or with the tunnel barrier layer 12 is composed of a material having a formula Me$_2$X, wherein Me is iron (Fe) and X is tantalum (Ta) or tungsten (W). In such embodiments, the paramagnetic hexagonal metal phase coupling spacer 18 can be composed of Fe$_2$W or Fe$_2$Ta. It is noted that the paramagnetic hexagonal metal phase coupling spacer 18 has a stoichiometric ratio of Me$_3$X or Me$_2$X.

The paramagnetic hexagonal metal phase coupling spacer 18 has a magnetic moment allowing for the use of a thick paramagnetic hexagonal metal phase coupling spacer 18. In one example, the paramagnetic hexagonal metal phase coupling spacer 18 can have a magnetic moment from 0 to 0.1 memu/cm$^2$.

The paramagnetic hexagonal metal phase coupling spacer 18 can have a thickness from 0.2 nm to 3 nm; although other thicknesses are contemplated and can be used in the present application for the thickness of the paramagnetic hexagonal metal phase coupling spacer 18. The paramagnetic hexagonal metal phase coupling spacer 18 serves as a texture providing layer (in replacing the seed layer used in bottom SAF devices) as well as a platinum diffusion barrier and allows for the use of a thin layer of platinum 20 (to be subsequently formed). In some embodiments, the paramagnetic hexagonal metal phase coupling spacer 18 can serve as a seed/template for the subsequently formed layer of platinum 20 and multilayered magnetic reference structure 22S. The presence of the paramagnetic hexagonal metal phase coupling spacer 18 permits the SAF coupling layer 26 of the multilayered magnetic reference structure 22S to have a coupling field plateau from 4000 Oe up to 6000 Oe.

The layer of platinum 20, which is positioned between the paramagnetic hexagonal metal phase coupling spacer 18 and the multilayered magnetic reference structure 22S, has a seed surface due to the presence of the paramagnetic hexagonal metal phase coupling spacer 18, which permits the formation of a multilayered magnetic reference structure 22S that has a hexagonal phase. The layer of platinum is a thin layer having a thickness of from 0.2 nm to 2 nm. Note that such a thickness is less than the thickness in bottom pinned SAF-containing structures.

The multilayered magnetic reference structure 22S includes a lower magnetic reference layer 24, a synthetic anti-ferromagnetic coupling layer 26 and an upper magnetic reference layer 28. Although the present application describes and illustrates that the multilayered magnetic reference structure 22S includes one stack of the lower magnetic reference layer 24, the synthetic anti-ferromagnetic coupling layer 26 and the upper magnetic reference layer 28, the present application contemplates embodiments in which the multilayered magnetic reference structure 22S includes a plurality of alternating stacks of the lower magnetic reference layer 24, the synthetic anti-ferromagnetic coupling layer 26 and the upper magnetic reference layer 28 stacked one atop the other.

The lower magnetic reference layer 24 can be composed of can be composed of a magnetic metal or magnetic metal alloy, including iron (Fe), nickel (Ni), cobalt (Co), chromium (Cr), boron (B), or manganese (Mn). Exemplary magnetic metal alloys can include the magnetic metals exemplified by the above for lower magnetic reference layer 24. In another embodiment, lower magnetic reference layer 24 can be a multilayer arrangement having (1) a high spin polarization region formed of a metal and/or metal alloy using the metals mentioned above, and (2) a region constructed of a material or materials that exhibit strong perpendicular magnetic anisotropy (strong PMA). Exemplary materials with strong PMA that can be used include a metal such as cobalt, nickel, platinum, palladium, iridium, or ruthenium, and can be arranged as alternating layers. The strong PMA region can also include alloys that exhibit strong intrinsic or bulk (as opposed to interface) PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys can be arranged as alternating layers. In one embodiment, lower magnetic reference layer 24 can have a thickness from 1 nm to 15 nm; although other thicknesses are possible and can be used as the thickness of the lower magnetic reference layer 24.

The synthetic anti-ferromagnetic coupling layer 26 can be composed of non-magnetic material that can couple in an anti-parallel fashion the lower and upper magnetic layers 24, 28 of the multilayered magnetic reference structure 22S. Exemplary non-magnetic materials that can be used as the synthetic anti-ferromagnetic coupling layer 26 include, but are not limited to, ruthenium (Ru), iridium (Jr) or rhodium (Rh) or alloys of Ru, Jr or Rh with each other (e.g., RuIr with Ru or Jr composition from 0 to 100%). In one embodiment, the synthetic anti-ferromagnetic coupling layer 26 can have a thickness from 0.2 nm to 1.2 nm; although other thicknesses are possible and can be used as the thickness of the synthetic anti-ferromagnetic coupling layer 26.

The upper magnetic reference layer 28 can be composed of one of the magnetic materials mentioned above for the lower magnetic reference layer 24. In some embodiments, the magnetic material that provides the upper magnetic reference layer 28 is compositionally the same as the magnetic material that provides the lower magnetic reference layer 24. In other embodiments, the magnetic material that provides the upper magnetic reference layer 28 is compositionally different from the magnetic material that provides the lower magnetic reference layer 24. In one embodiment, upper magnetic reference layer 28 can have a thickness from 1 nm to 15 nm; although other thicknesses are possible and can be used as the thickness of the upper magnetic reference layer 28.

In one illustrated embodiment, multilayered magnetic reference structure 22S, upper magnetic reference layer 28 and the lower magnetic reference layer 24 are both composed of Co and the synthetic anti-ferromagnetic coupling layer 26 is composed of Ir.

In some embodiments (not shown), a layer of MTJ capping material can be formed upon the uppermost surface of the multilayered magnetic reference structure 22S. When present, the MTJ capping material can include, but it is not limited to, Nb, NbN, W, WN, Ta, TaN, Ti, TiN, Ru, Mo, Cr, V, Pd, Pt, Rh, Sc, Al or other high melting point metals or conductive metal nitrides. In some embodiments, a separate MTJ cap is not formed and a lower portion of the top electrode mentioned above can function as a capping layer. The layer of MTJ capping material can have a thickness from 2 nm to 25 nm; other thicknesses are possible and can be used in the present application as the thickness of the layer of MTJ capping material.

Figure 2B:
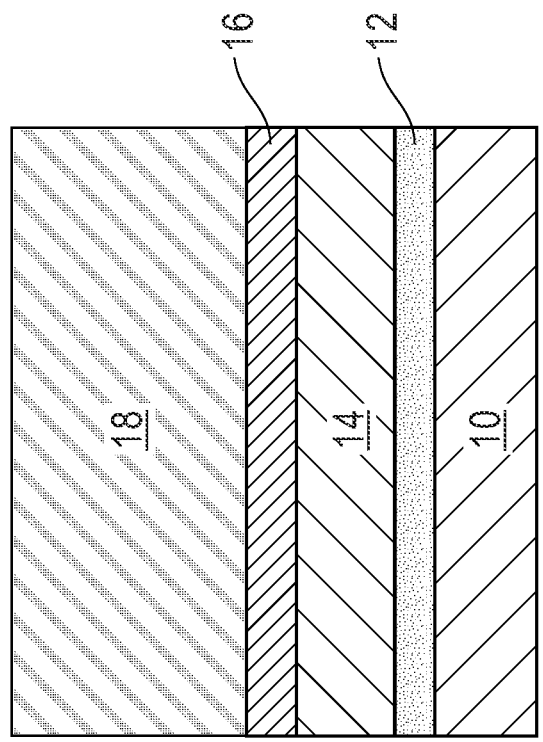

Reference is now made to FIGS. 2A-2B which illustrate the basic processing steps that can be used in the present application in forming the exemplary memory structure shown in FIG. 1. Referring first to FIG. 2A, there is illustrated a first step in which a material stack that includes, from bottom to top, a magnetic free layer 10, a tunnel barrier layer 12, and a precursor paramagnetic hexagonal metal phase material forming multilayered structure 30 is formed. The material stack can also include a polarization enhancing layer 14 and a non-magnetic spacer 16 located between the tunnel barrier layer 12 and the precursor paramagnetic hexagonal metal phase material forming multilayered structure 30. The magnetic free layer 10, the tunnel barrier layer 12, the polarization enhancing layer 14 and the non-magnetic spacer 16 include materials and have thicknesses as mentioned above in describing the exemplary memory structure shown in FIG. 1. The magnetic reference layer 10, the tunnel barrier layer 12, the polarization enhancing layer 14 and the non-magnetic spacer 16 of the material stack illustrated in FIG. 2A can be formed utilizing one or more deposition processes including, but not limited to, chemical vapor deposition (CVD), plasma enhanced chemical vapor deposition (PECVD), physical vapor deposition (PVD), atomic layer deposition (ALD) or sputtering.

The material stack shown in FIG. 2A also includes the precursor paramagnetic hexagonal metal phase material forming multilayered structure 30. In embodiments, the precursor paramagnetic hexagonal metal phase material forming multilayered structure 30 includes alternating layers of a magnetic metal, Me, and metal, X, wherein Me and X are as defined above. Each layer of magnetic metal, Me, can be referred to as magnetic material layer 32, and each layer of metal, X, can be referred to herein as X-containing metal layer 34. It is noted that each X-containing metal layer 34 includes a metal that alloys with Me in a hexagonal phase and dilutes the magnetic moment of Me. In the precursor paramagnetic hexagonal metal phase material forming multilayered structure 30, each X-containing metal layer 34 is sandwiched between a bottom magnetic material layer 32 and a top magnetic material layer 32 such that the precursor paramagnetic hexagonal metal phase material forming multilayered structure 30 includes n numbers of X-containing metal layer 34 and n+1 number of magnetic material layers 32, wherein n an integer that is 1 or greater. By way of one example, the precursor paramagnetic hexagonal metal phase material forming multilayered structure 30 shown in FIG. 2A includes two X-containing metal layer 34 and three magnetic material layers 32. It is noted that the precursor paramagnetic hexagonal metal phase material forming multilayered structure 30 is designed to provide a proper ratio Me and X such that a hexagonal metal phase material can be subsequently formed therefrom. In one example, the precursor paramagnetic hexagonal metal phase material forming multilayered structure 30 is designed to provide a ratio of Me/X ratio of 5:2. In such an embodiment can provide a $Co_3W$ or $Co_3Nb$ coupling spacer having a hexagonal metal phase will be subsequently formed.

In some embodiments, the precursor paramagnetic hexagonal metal phase material forming multilayered structure 30 is formed by co-sputtering from a magnetic metal, Me, containing target, and from a metal, X, containing target. In other embodiments, any of the above mentioned deposition processes can be used to form the precursor paramagnetic hexagonal metal phase material forming multilayered structure 30.

The material stack illustrated in FIG. 2A can then be subjected to a thermal soaking process which converts the precursor paramagnetic hexagonal metal phase material 30 (including the various magnetic material layers 32 and X-containing metal layers 34) into a paramagnetic hexagonal metal phase material coupling spacer 18 having the formula $Me_3X$, wherein Me is Co and X is the metal (i.e., V, Nb, Ta, Mo or W) that alloys with Co in a hexagonal phase and dilutes the magnetic moment of Co. Alternatively, the paramagnetic hexagonal metal phase material coupling spacer 18 that is formed has the formula $Me_2X$, wherein Me is Fe and X is the metal (i.e., Ta or W) that alloys with Fe in a hexagonal phase and dilutes the magnetic moment of Fe. The material stack that is formed after performing the thermal soak processing step is shown in FIG. 2B. The paramagnetic hexagonal metal phase material coupling spacer 18 provides a seed/template for the subsequent formation of a layer of platinum.

In embodiments, the thermal soaking can be performed at a temperature from 300° C. to 450° C. In embodiments, the thermal soaking is performed in a vacuum or in an inert ambient. The thermal soak converts the precursor paramagnetic hexagonal metal phase material 30 into the paramagnetic hexagonal metal phase material coupling spacer 18, as defined above. In some embodiments, the thermal soak can be performed in a UHV deposition system Next, a layer of platinum 20, and a multilayered magnetic reference structure 22S are formed in a stacked fashion on the paramagnetic hexagonal metal phase material coupling spacer 18 shown in FIG. 2B to provide the exemplary material stack shown in FIG. 1. The multilayered magnetic reference structure 22S includes synthetic anti-ferromagnetic (SAF) coupling layer 26, as defined above, located between lower magnetic reference layer 24, as defined above, and upper magnetic reference layer 28, as defined above. The layer of platinum 20 and the multilayered magnetic reference structure 22S can be formed utilizing one or more deposition processes including, but not limited to, CVD, PECVD, PVD, ALD or sputtering.

Figure 3:
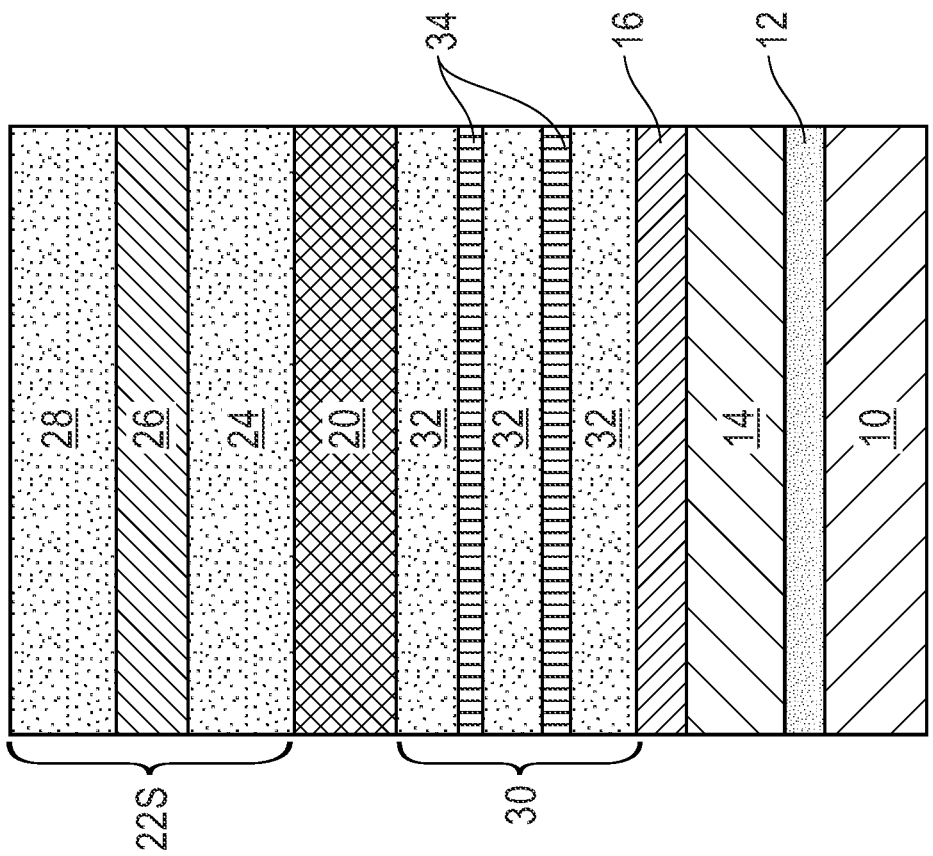
FIG. 3 is a cross sectional view of an exemplary material stack that can be used in providing the exemplary memory structure shown in FIG. 1 in accordance with another embodiment of the present application.

In some embodiments, the exemplary structure shown in FIG. 1 can be formed by first providing the exemplary material stack shown in FIG. 2A. After providing that material stack, the layer of platinum 20, and the multilayered magnetic reference structure 22S are formed in a stacked fashion atop the precursor paramagnetic hexagonal metal phase material 30 to provide the material stack shown in FIG. 3. After such a material stack is formed, a thermal soak as defined above can be performed to convert the precursor paramagnetic hexagonal metal phase material 30 shown in FIG. 3 into a paramagnetic hexagonal metal phase material coupling spacer 18 as shown in FIG. 1.

In some embodiments, and after forming the material stack shown in FIG. 1 the material stack can be patterned to provide a pillar shaped structure. Patterning can be performed by lithography and etching. In embodiments, the patterning can be formed on the structure shown in FIG. 2A or the structure shown in FIG. 2B.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A memory structure comprising:
    a top pinned magnetic tunnel junction structure including, from bottom to top, a magnetic free layer, a tunnel barrier layer, a paramagnetic hexagonal metal phase coupling spacer, a layer of platinum, and a multilayered magnetic reference structure containing a synthetic anti-ferromagnetic (SAF) coupling layer located between a lower magnetic reference layer and an upper magnetic reference layer.

2. The memory structure of claim 1, wherein the paramagnetic hexagonal metal phase coupling spacer is composed of a material having a formula $Me_3X$, wherein Me is cobalt (Co), and X is vanadium (V), niobium (Nb), tantalum (Ta), molybdenum (Mo) or tungsten (W).

3. The memory structure of claim 2, wherein X is niobium (Nb) or vanadium (V).

4. The memory structure of claim 1, wherein the paramagnetic hexagonal metal phase coupling spacer is composed of a material having a formula $Me_2X$, wherein Me is iron (Fe) and X is tantalum (Ta) or tungsten (W).

5. The memory structure of claim 4, wherein X is tantalum (Ta).

6. The semiconductor structure of claim 1, wherein the paramagnetic hexagonal metal phase coupling spacer has a magnetic moment.

7. The memory structure of claim 6, wherein the magnetic moment of the paramagnetic hexagonal metal phase coupling spacer is from 0 to 0.1 memu/cm².

8. The memory structure of claim 6, wherein the paramagnetic hexagonal metal phase coupling spacer has a thickness from 0.2 nm to 3 nm.

9. The memory structure of claim 1, wherein the paramagnetic hexagonal metal phase coupling spacer has a thickness that inhibits platinum diffusion into the magnetic free layer.

10. The memory structure of claim 9, wherein the layer of platinum has a thickness from 0.2 nm to 2 nm.

11. The memory structure of claim 1, wherein the SAF coupling layer has a coupling field plateau from 4000 Oe up to 6000 Oe.

12. The memory structure of claim 1, wherein the multilayered magnetic reference structure has a hexagonal crystal structure.

13. The memory structure of claim 1, wherein the SAF coupling layer is a non-magnetic material that couples in an anti-parallel fashion the lower magnetic reference layer and the upper magnetic reference layer.

14. The memory structure of claim 13, wherein the SAF coupling layer comprises ruthenium (Ru), iridium (Ir), rhodium (Rh) or alloys of Ir, Ru or Rh with each other.

15. The memory structure of claim 1, further comprising at least one of a polarization enhancing layer and a non-magnetic spacer located between the tunnel barrier layer and the paramagnetic hexagonal metal phase coupling spacer.

16. A method comprising:
forming a material stack including a magnetic reference layer, a tunnel barrier layer, and a precursor paramagnetic hexagonal metal phase material forming multilayered structure, wherein the precursor paramagnetic hexagonal metal phase material forming multilayered structure comprises alternating layers of a magnetic metal, Me, having a magnetic moment, and a metal, X, wherein X is a metal that alloys with Me in a hexagonal phase and dilutes the magnetic moment of Me;
thermal soaking the material stack to convert the precursor paramagnetic hexagonal metal phase material forming multilayered structure into a paramagnetic hexagonal metal phase material coupling spacer; and
forming a layer of platinum and a multilayered magnetic reference structure in a stacked fashion on the paramagnetic hexagonal metal phase material coupling spacer, wherein the multilayered magnetic reference structure comprises a synthetic anti-ferromagnetic (SAF) coupling layer located between a lower magnetic reference layer and an upper magnetic reference layer.

17. The method of claim 16, wherein the precursor paramagnetic hexagonal metal phase material forming multilayered structure is formed by co-sputtering from a magnetic metal, Me-containing target, and from a metal, X, containing target.

18. The method of claim 16, wherein the precursor paramagnetic hexagonal metal phase material forming multilayered structure has a thickness or atom ratio of Me and X that provides the paramagnetic hexagonal metal phase material coupling spacer.

19. The method of claim 16, wherein the thermal soaking is performed at a temperature from 300° C. to 450° C.

20. The method of claim 16, wherein Me is cobalt (Co) and X is vanadium (V), niobium (Nb), tantalum (Ta), molybdenum (Mo) or tungsten (W), and the paramagnetic hexagonal metal phase material coupling spacer has a formula $Me_3X$.

21. The method of claim 16, wherein Me is iron (Fe) and X is tantalum (Ta) or tungsten (W), and the paramagnetic hexagonal metal phase material coupling spacer has a formula $Me_2X$.

22. The method of claim 16, wherein the material stack further comprises a polarization enhancing layer and a non-magnetic spacer located between the tunnel barrier layer and the precursor paramagnetic hexagonal metal phase material forming multilayered structure.

23. A method comprising:
forming a material stack including a magnetic reference layer, a tunnel barrier layer, a precursor paramagnetic hexagonal metal phase material forming multilayered structure, a layer of platinum and a multilayered magnetic reference structure, wherein the precursor paramagnetic hexagonal metal phase material forming multilayered structure comprises alternating layers of a magnetic metal, Me, having a magnetic moment, and a metal, X, wherein X is a metal that alloys with Me in a hexagonal phase and dilutes the magnetic moment of Me; and
thermal soaking the material stack to convert the precursor paramagnetic hexagonal metal phase material forming multilayered structure into a paramagnetic hexagonal metal phase material coupling spacer.

24. The method of claim 23, wherein the precursor paramagnetic hexagonal metal phase material forming multilayered structure is formed by co-sputtering from a magnetic metal, Me-containing target, and from a metal, X, containing target.

25. The method of claim 23, wherein the precursor paramagnetic hexagonal metal phase material forming multilayered structure has a thickness or atom ratio of Me and X that provides the paramagnetic hexagonal metal phase material coupling spacer.

26. The method of claim 23, wherein Me is cobalt (Co) and X is vanadium (V), niobium (Nb), tantalum (Ta), molybdenum (Mo) or tungsten (W), and the paramagnetic hexagonal metal phase material coupling spacer has a formula $Me_3X$.

27. The method of claim 23, wherein Me is iron (Fe) and X is tantalum (Ta) or tungsten (W), and the paramagnetic hexagonal metal phase material coupling spacer has a formula $Me_2X$.

* * * * *